(12) United States Patent
Lu

(10) Patent No.: US 10,269,568 B2
(45) Date of Patent: Apr. 23, 2019

(54) MULTI-GATE FETS AND METHODS FOR FORMING THE SAME

(71) Applicant: Taiwan Semiconductor Manufacturing Company, Ltd., Hsinchu (TW)

(72) Inventor: Wen-Tai Lu, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/859,803

(22) Filed: Jan. 2, 2018

(65) Prior Publication Data

US 2018/0145074 A1    May 24, 2018

Related U.S. Application Data

(60) Continuation of application No. 15/362,234, filed on Nov. 28, 2016, now Pat. No. 10,103,025, which is a
(Continued)

(51) Int. Cl.
| H01L 29/78 | (2006.01) |
| H01L 21/265 | (2006.01) |
| H01L 29/66 | (2006.01) |
| H01L 27/088 | (2006.01) |
| H01L 29/06 | (2006.01) |
| H01L 21/02 | (2006.01) |
| H01L 21/311 | (2006.01) |
| H01L 21/762 | (2006.01) |

(Continued)

(52) U.S. Cl.
CPC .... *H01L 21/2652* (2013.01); *H01L 21/02164* (2013.01); *H01L 21/02236* (2013.01); *H01L 21/26513* (2013.01); *H01L 21/26586* (2013.01); *H01L 21/31111* (2013.01); *H01L 21/76224* (2013.01); *H01L 21/823431* (2013.01); *H01L 21/823481* (2013.01); *H01L 27/0886* (2013.01); *H01L 29/0649* (2013.01); *H01L 29/0653* (2013.01); *H01L 29/66803* (2013.01); *H01L 29/66818* (2013.01); *H01L 29/7851* (2013.01); *H01L 29/7853* (2013.01); *H01L 29/7854* (2013.01); *H01L 21/02255* (2013.01); *H01L 29/0847* (2013.01)

(58) Field of Classification Search
CPC .............. H01L 29/06; H01L 29/66803; H01L 29/7851; H01L 29/7853
See application file for complete search history.

(56) References Cited

U.S. PATENT DOCUMENTS

| 9,508,714 B2 | 11/2016 | Lu |
| 2004/0036095 A1 | 2/2004 | Brown et al. |

(Continued)

FOREIGN PATENT DOCUMENTS

| JP | 2008117838 A | 5/2008 |
| KR | 20040110817 A | 12/2004 |

*Primary Examiner* — Thomas L Dickey
(74) *Attorney, Agent, or Firm* — Slater Matsil, LLP

(57) ABSTRACT

A method includes oxidizing a semiconductor fin to form an oxide layer on opposite sidewalls of the semiconductor fin. The semiconductor fin is over a top surface of an isolation region. After the oxidizing, a tilt implantation is performed to implant an impurity into the semiconductor fin. The oxide layer is removed after the tilt implantation.

20 Claims, 7 Drawing Sheets

Related U.S. Application Data continuation of application No. 14/525,461, filed on Oct. 28, 2014, now Pat. No. 9,508,714, which is a division of application No. 13/541,457, filed on Jul. 3, 2012, now Pat. No. 8,883,570.

(51) Int. Cl.
*H01L 21/8234* (2006.01)
*H01L 29/08* (2006.01)

(56) References Cited

U.S. PATENT DOCUMENTS

| | | |
|---|---|---|
| 2004/0256683 A1 | 12/2004 | Lee et al. |
| 2005/0239254 A1* | 10/2005 | Chi .................. H01L 29/66795 |
| | | 438/270 |
| 2007/0004107 A1 | 1/2007 | Lee et al. |
| 2007/0048947 A1 | 3/2007 | Lee et al. |
| 2007/0272971 A1* | 11/2007 | Lee ...................... H01L 27/105 |
| | | 257/321 |
| 2008/0099858 A1 | 5/2008 | Kawakita |
| 2008/0277739 A1* | 11/2008 | Curatola ......... H01L 21/823412 |
| | | 257/393 |
| 2009/0045449 A1 | 2/2009 | Aritome |
| 2009/0045454 A1 | 2/2009 | Takaya et al. |
| 2009/0184369 A1 | 7/2009 | Zhu |
| 2009/0294840 A1 | 12/2009 | Gilgen et al. |
| 2011/0238391 A1 | 9/2011 | Suzuki |
| 2013/0228863 A1 | 9/2013 | Wang |

* cited by examiner

MULTI-GATE FETS AND METHODS FOR FORMING THE SAME

PRIORITY CLAIM AND CROSS-REFERENCE

This application is a continuation of U.S. patent application Ser. No. 15/362,234, entitled "Multi-Gate FETs and Methods for Forming the Same," filed on Nov. 28, 2016, which is a continuation of U.S. patent application Ser. No. 14/525,461, entitled "Multi-Gate FETs and Methods for Forming the Same," filed on Oct. 28, 2014, now U.S. Pat. No. 9,508,714 issued Nov. 29, 2016, which application is a divisional U.S. patent application Ser. No. 13/541,457, entitled "Multi-Gate FETs and Methods for Forming the Same," filed on Jul. 3, 2012, now U.S. Pat. No. 8,883,570 issued Nov. 11, 2014, which applications are incorporated herein by reference.

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFETs), also known as multi-gate FETs, were thus developed. A typical FinFET includes a semiconductor fin above a substrate, which fin is used to form the channel region of the FinFET. The channel region includes sidewall portions and sometimes a top surface portion of the semiconductor fin. When the channel region includes the sidewalls portions but not the top surface portion, the respective FinFET is referred to as a dual-gate FinFET. When the channel regions include the sidewalls portions and the top surface portion, the respective FinFET is referred to as a tri-gate FinFET.

Some of the FinFETs are formed starting from silicon-on-insulator substrates. The respective FinFETs have reduced leakage currents. The manufacturing cost, however, is high. Some other FinFETs are formed starting from bulk silicon substrates. Accordingly, the resulting fins are connected to the bulk substrate through the silicon strips that are formed in Shallow Trench Isolation (STI) regions. Accordingly, leakage currents may flow through the semiconductor strips.

Conventionally, a heavy doping may be applied through an implantation, so that the dopants may be implanted into the silicon strips that are between STI regions. The heavy doping in the silicon strips help suppress the leakage currents. Such method, however, causes the respective dopant to be adversely introduced into the silicon fins that are overlying the silicon strips. Accordingly, the threshold voltages Vth of the respective FinFETs are reduced.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method for forming a Fin Field-Effect Transistor (FinFET) is provided. The intermediate stages in the manufacturing of the FinFET in accordance with an embodiment are illustrated. The variations of the embodiment are discussed. Throughout the various views and illustrative embodiments, like reference numbers are used to designate like elements.

Figure 1:
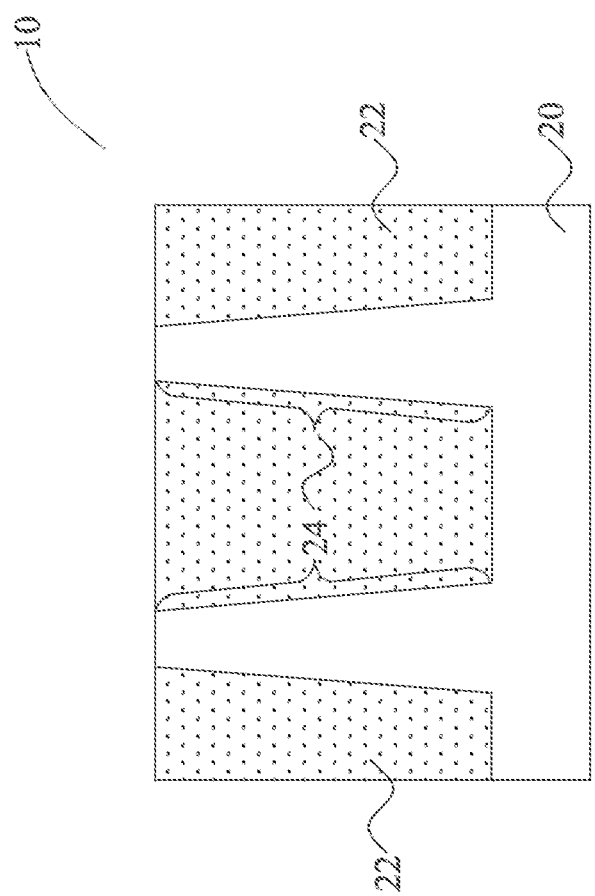
FIGS. 1 through 6B are cross-sectional views of intermediate stages in the manufacturing of a Fin Field-Effect Transistor (FinFET) in accordance with some exemplary embodiments.

FIGS. 1 through 6B illustrate cross-sectional views in the formation of a FinFET in accordance with some embodiments. Referring to FIG. 1, a structure is formed. The illustrated structure includes a part of wafer 10, which further includes substrate 20. Substrate 20 may be a silicon substrate, a germanium substrate, or a substrate formed of III-V compound semiconductor materials. Substrate 20 may be doped with a p-type or an n-type impurity. Isolation regions such as Shallow Trench Isolation (STI) regions 22 may be formed over the bulk portion of substrate 20. Semiconductor strips 24 are formed in STI regions 22, and are between opposite STI regions 22. The bottoms of semiconductor strips 24 may be portions of substrate 20, and are connected to the bulk portion of substrate 20. The formation of the structure in FIG. 1 may include forming trenches (occupied by STI regions 22) in substrate 20, filling dielectric materials in the trenches, and then performing a Chemical Mechanical Polish (CMP) to remove excess dielectric materials. The remaining portions of the dielectric materials are STI regions 22. STI regions 22 may comprise an oxide such as silicon oxide.

Figure 2:
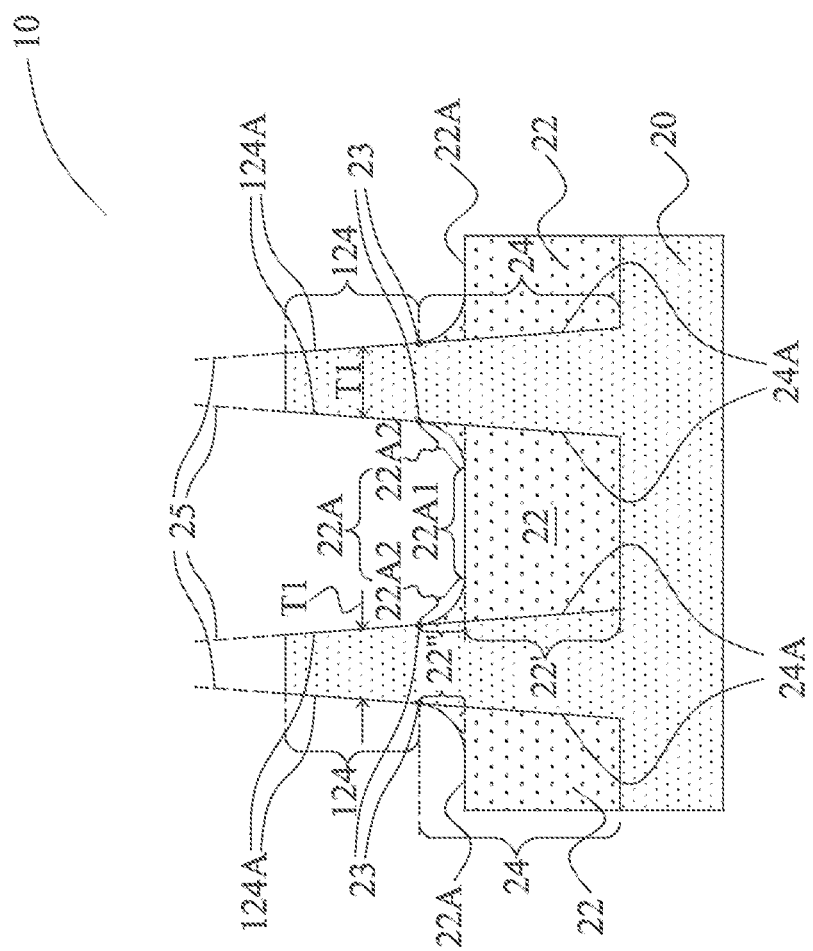

Next, referring to FIG. 2, STI regions 22 are recessed. Throughout the description, the portions of semiconductor strips 24 that are above the remaining portions of STI regions 22 are referred to as semiconductor fins 124. The remaining portions of STI regions 22 have top surfaces 22A. In some embodiments, a top surface 22A includes a substantially flat portion 22A1, and slant portions 22A2 connected to, and over, the substantially flat portion 22A1. Flat portion 22A1 may be the portion close to the middle of neighboring fins 124. Slant portions 22A2 may be the portions close to fins 124. Furthermore, STI regions 22 may be considered as including portions 22' that has substantially top surfaces 22A1, and protruding portions 22" over portions 22' and having slant top surfaces 22A2. The top tips 23 of protruding portions 22" may adjoin the respective fins 124. The middle thickness T1 of a fin 124 is measured at the middle level between the top surface of fins 124 and the bottom of fins 124 (with the bottom level with tips 23). The middle thickness T1 is referred throughout the description as the thickness of the respective fin 124.

In some embodiments, sidewalls 24A of semiconductor strips 24 are substantially straight, and may be substantially vertical or slightly tilted. Sidewalls 124A of semiconductor fins 124 are also substantially straight, and may be substantially vertical or slightly tilted. Furthermore, each of sidewalls 124A and its underlying and connecting sidewall 24A may be in the same plane 25. Alternatively stated, in the cross-sectional view in FIG. 2, when an extension plane (which overlaps plane 25) is drawn upwardly from one of sidewalls 24A, the extension plane substantially overlap the corresponding overlying sidewall 124A.

Figure 3:
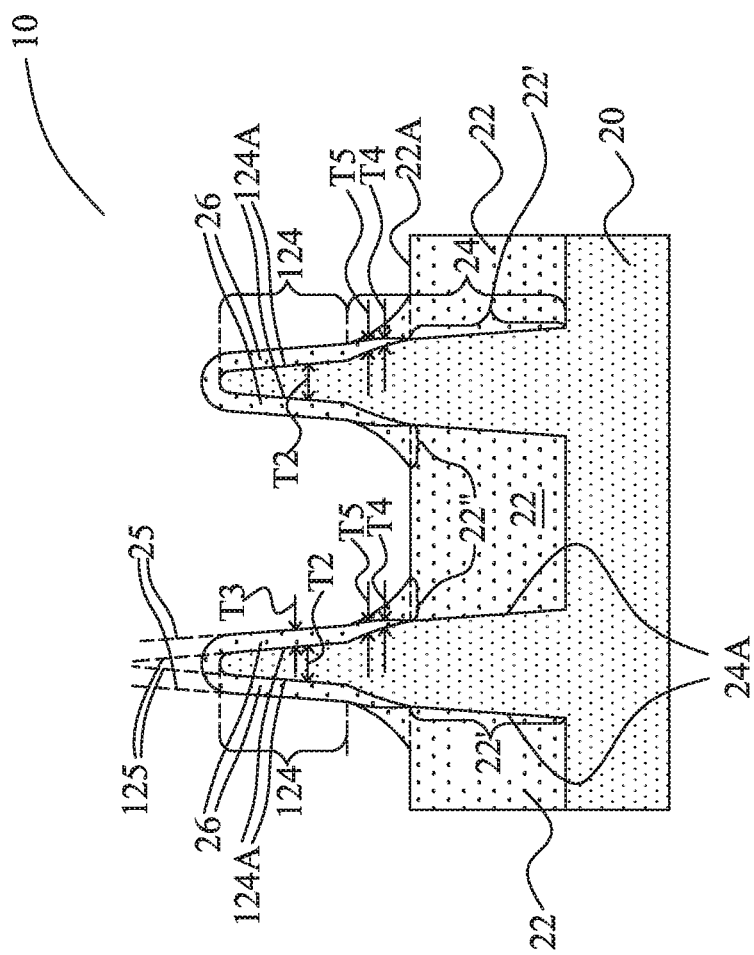

Referring to FIG. 3, an oxidation is performed to oxidize the surface layers of fins 124. Oxide layer 26 is thus formed, which may be a silicon oxide layer, depending on the material of fins 124. Oxide layer 26 includes portions on opposite sidewalls of fins 124, and top portion over fins 124.

In some embodiments, the oxidation is performed through an In-Situ Steam Generation (ISSG) step. In alternative embodiments, the oxidation is performed by annealing wafer 10 in an oxygen-containing environment such as an oven. Due to the oxidation, the thicknesses of fins 124 are reduced. For example, the middle thickness T2 of a fin 124 may be reduced to smaller than about 75 percent, smaller than about 55 percent, or between about 55 and about 75 percent, middle thickness T1 (shown in FIG. 2) of fins 124, which is measured before the oxidation. Middle thickness T2 may also be between about 25 percent and about 45 percent thickness T1. In some embodiments, thickness T3 of oxide layer 26 is between about 30 Å and about 60 Å. It is appreciated, however, that the dimensions recited throughout the description are merely examples, and may be changed to different values.

Due to the oxidation, the corners (the illustrated top left corner and top right corner) of fins 124 are rounded. This results in the improvement in the performance of the resulting FinFET 62 (FIGS. 6A and 6B) since sharp corners may result in the increase in leakage currents, and are detrimental to the reliability of FinFET 62 due to the high electrical field density at corners. In addition, the bottom portions of semiconductor strips 24 are protected by STI regions 22, and the oxidation to the bottom portions of semiconductor strips 24 is minimal, if any. The top portions of semiconductor strips 24 adjacent to STI portions 22" may also be oxidized. The thicknesses (T4 and T5, for example) of the portions of oxide layer 26 generated from the top portions of semiconductor strips 24, however, is smaller than thickness T3. The resulting thickness of the upper portions is also related to the respective positions. For example, thickness T4 of oxide layer 26 is smaller than thickness T5, and the higher the position is, the thicker the resulting oxide layer 26 generated from semiconductor strip 24.

Due to the oxidation, fins 124 are thinned. Due to the thinning of fins 124, the planes 125 of sidewalls 124A and the respective planes 25 of sidewalls 24A no longer overlap with each other. Instead, planes 25 of opposite sidewalls 24A define a region therein, and fins 124 are inside the region. Portions of sidewalls 124A may be substantially planar and parallel to portions of sidewalls 24A, which portions are in planes 125. In the embodiments wherein sidewalls 24A and 124A are substantially vertical, the distance between opposite sidewalls 124A is smaller than the distance between opposite sidewalls 24A.

Figure 4:
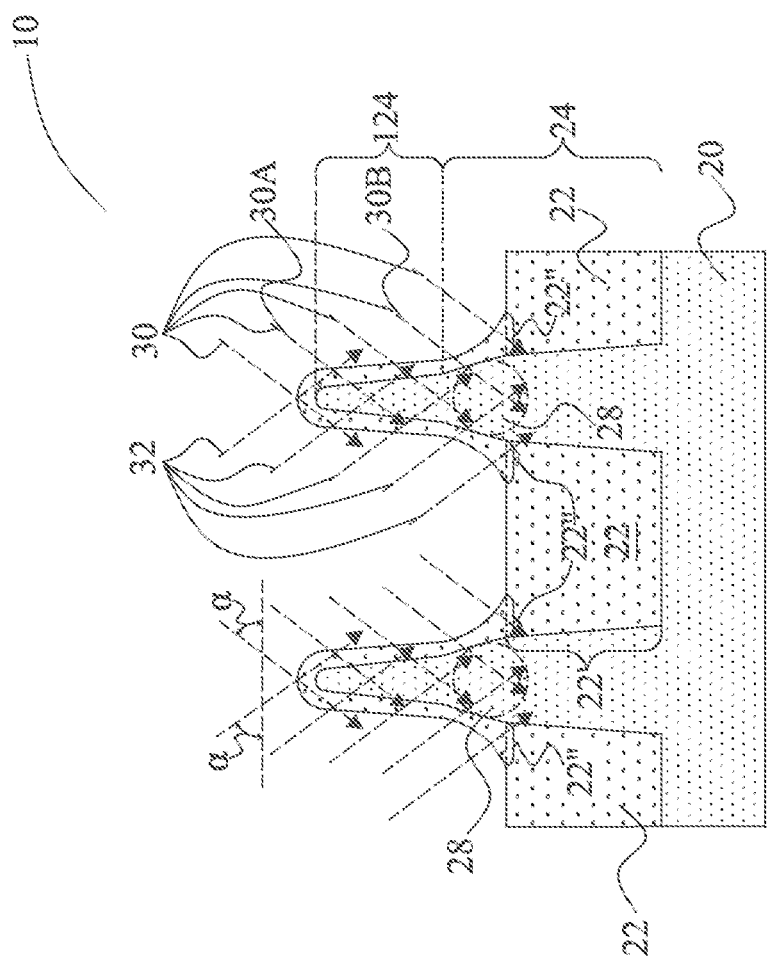

FIG. 4 illustrates tilt implantations to form doped regions 28, which are in the top portions of semiconductor strips 24. If the resulting FinFET 42 (FIGS. 6A and 6B) is an n-type FinFET, which means that if the source and drain regions 44 (FIG. 6B) of FinFET 42 is of n-type, then the doped impurity is of p-type, and vice versa. Tilt angles α of the implantation may be between about 20 degrees and about 45 degrees. It is appreciated, however, that the tilt angle recited throughout the description are merely examples, and may be changed to different values. The tilt implantation may include two tilt implantations tilted in opposite directions, as illustrated by arrows 30 and 32, or just one tilt implantation. The implanted impurity, when of p-type, may comprise boron, indium, or combinations thereof. Conversely, the implanted impurity, when of n-type, may comprise phosphorous, arsenic, antimony, or combinations thereof.

The energy of the implantation is controlled, so that a significant amount, for example, 30 percent or more of the implanted impurities penetrates through fins 124, and reach the portion of oxide layer 26 that opposite the side from which the impurity is implanted from. For example, if the dopant is implanted from right, and the implantation is tilt toward left, as schematically illustrated by arrows 30, a significant portion of the dopant may penetrate through fins 124, and reach the portions of oxide layer 26 on the left side of the respective fins 124. Some of the dopants may also penetrate through fins 124 and the portions of oxide layer 26 on both sides of fins 124. The portions of the implanted impurity not stopped in fins 124 do not contribute to the impurity concentration of fins 124. Accordingly, by oxidizing fins 124 to make fins 124 thinner, and to adjust the energy of the implantation, the impurity concentration in fins 124, which impurity concentration is resulted from the implantation, is reduced. With the reduced impurity concentration in fins 124, the threshold voltage Vth of the resulting FinFET is increased. In some exemplary embodiments in which boron is implanted, the tilt implantation is performed using an energy between about 4 keV and about 10 keV. In alternative exemplary embodiments in which phosphorous is implanted, the tilt implantation may be performed using an energy between about 10 keV and about 30 keV.

On the other hand, in regions 28, due to the portions 22" of STI regions 22, the implanted impurity is stopped in regions 28, and hence the impurity concentration in regions 28 is high. Again, the energy of the implantation is also controlled so that the implanted impurity may be stopped in regions 28. A high impurity concentration in regions 28 helps reduce the leakage currents that flows between the source and the drain regions of the resulting FinFET, which leakage currents flow through regions 28. As a result of the implantation and the controlled energy, the concentration of the implanted impurity in regions 28 is higher than the concentration of the implanted impurity in the middle portions of semiconductor fins 124.

Figure 5:
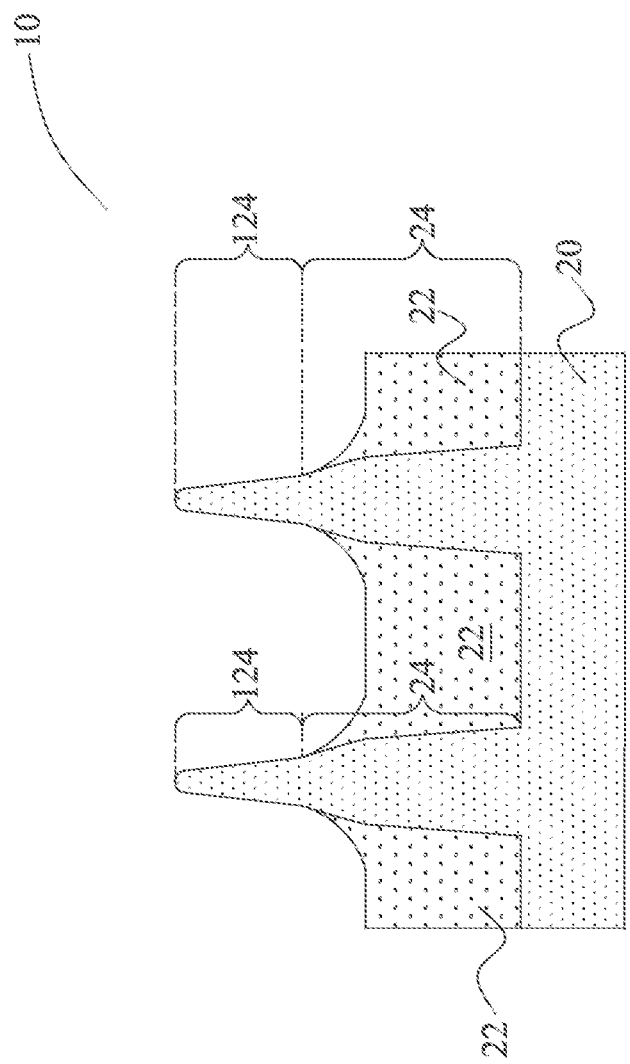
Figure 6A:
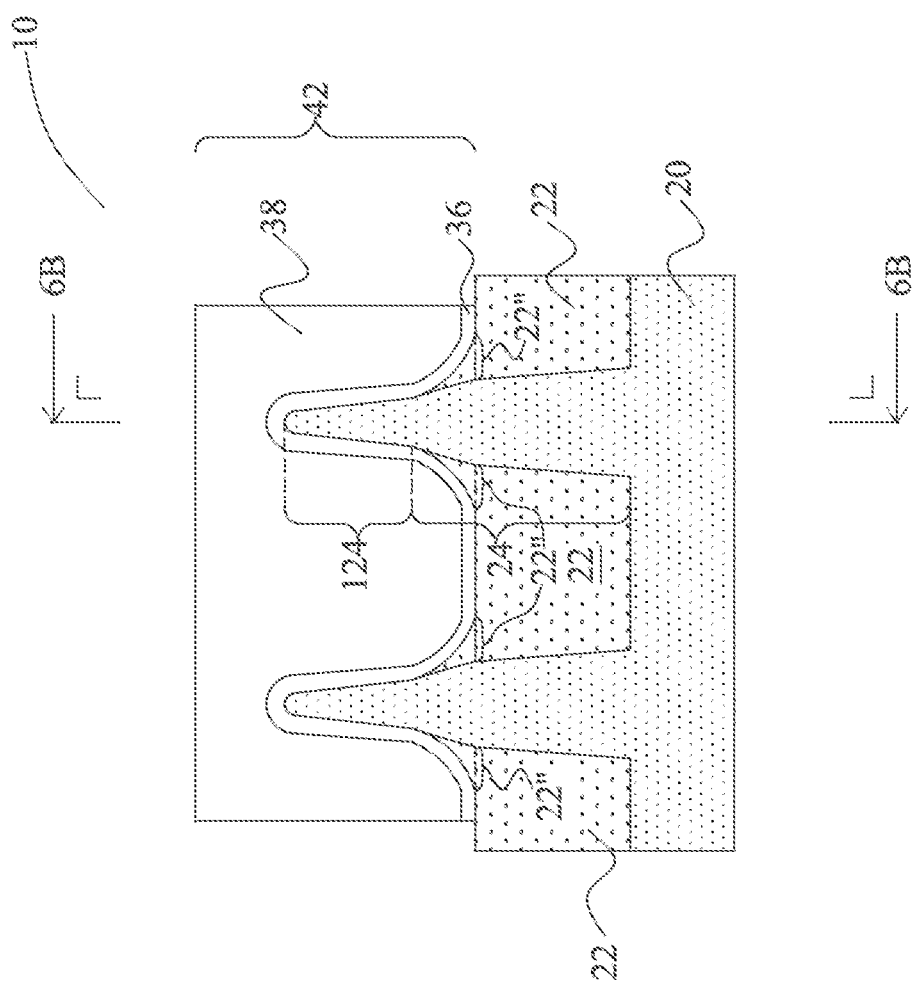

Referring to FIG. 5, oxide layer 26 is removed, for example, using a diluted HF solution. Fins 124 are thus exposed. Next, as shown in FIG. 6A, gate dielectric layer 36 and gate electrode 38 are formed. In accordance with some embodiments, gate dielectric 36 comprises silicon oxide, silicon nitride, or multilayers thereof. In alternative embodiments, gate dielectric 36 comprises a high-k dielectric material, and hence is alternatively referred to as high-k gate dielectric 36 throughout the description. High-k gate dielectric 36 may have a k value greater than about 7.0, and may include a metal oxide or a silicate of Hf, Al, Zr, La, Mg, Ba, Ti, Pb, and combinations thereof. The formation methods of gate dielectric 36 may include Molecular-Beam Deposition (MBD), Atomic Layer Deposition (ALD), Physical Vapor Deposition (PVD), and the like.

Gate electrode 38 is formed over gate dielectric 36. Gate electrode 38 may comprise a metal-containing material such as polysilicon, TiN, TaN, TaC, Co, Ru, Al, combinations thereof, and multi-layers thereof. The formation of gate dielectric 36 and gate electrode 38 may include blanket depositing a gate dielectric layer, and a gate electrode layer over the gate dielectric layer, and then patterning the gate dielectric layer and the gate electrode layer. The remaining components of the FinFET, including source and drain regions 44 (FIG. 6B) and source and drain silicides (not shown), are then formed, and the resulting FinFET is referred to as FinFET 42. The formation processes of these components are not discussed herein.

Figure 6B:
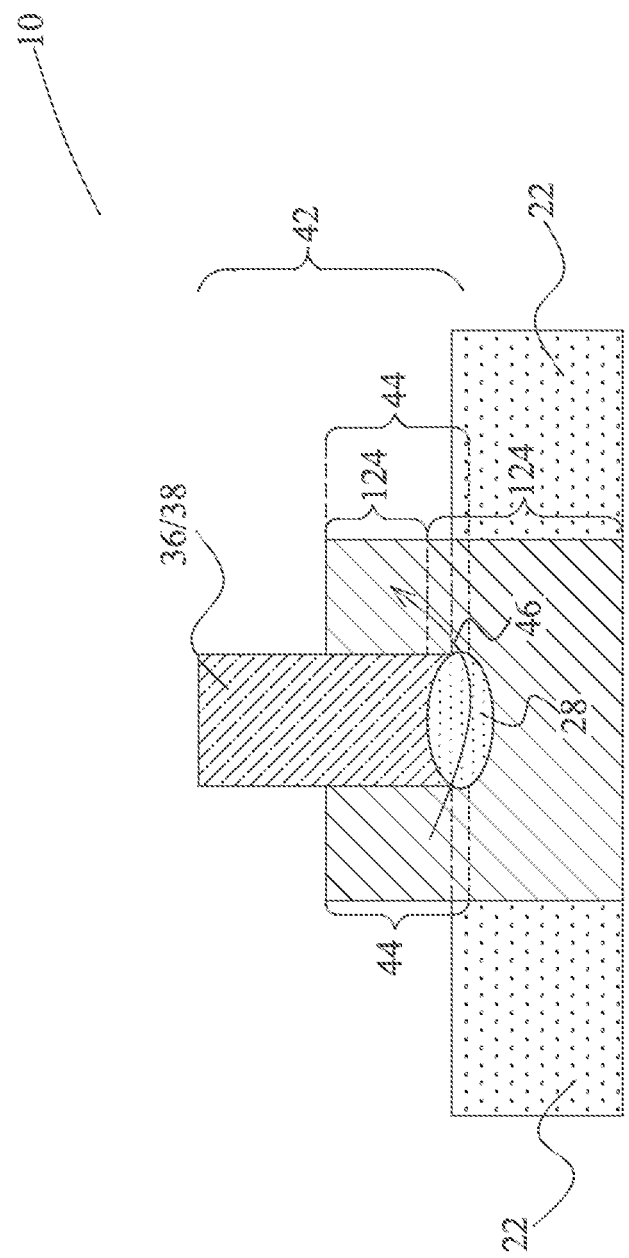

FIG. 6B illustrates a cross-sectional view of the structure shown in FIG. 6A, wherein the cross-sectional view is retrieved from the plane crossing line 6B-6B in FIG. 6A. As shown in FIG. 6B, regions 28 are between source and drain regions 44. Regions 28 are located where gate electrode 38 has less control to the currents due to the existence of portions 22" (FIG. 6A) of STI regions 22. Accordingly, with regions 28 have a high doping concentration, the leakage current 46, which flows through regions 28, is reduced.

FIGS. 6A and 6B illustrate gate dielectric 36 and gate electrode 38 that are formed using the gate-first approach, wherein gate dielectric 36 and gate electrode 38 are formed before the formation of source/drain regions 44 (FIG. 6). In alternative embodiments, gate dielectric 36 and gate electrode 38 may be formed using a gate-last approach, wherein the gate dielectric and the gate electrode of FinFET 42 are formed after the formation of the respective source/drain regions 44. The respective process includes forming a dummy gate (not shown), forming source/drain regions 44, forming an Inter-Layer Dielectric (ILD, not shown) over source/drain regions 44, removing the dummy gate to form a recess in the ILD, and forming a gate dielectric layer and the gate electrode layer into the recess. A CMP is then performed to remove the portions of the gate dielectric layer and the gate electrode layer over the ILD.

In the embodiments, the undesirable increase in the doping concentration in fins 124, which is caused by the doping in regions 28, is reduced since some of the implanted impurity penetrate through fins 124, and hence do not contribute to the impurity concentration in fins 124. Furthermore, with fins 124 thinned in the oxidation process, the device performance of the resulting FinFET 42 is improved.

In accordance with embodiments, a method includes oxidizing a semiconductor fin to form an oxide layer on opposite sidewalls of the semiconductor fin. The semiconductor fin is over a top surface of an isolation region. After the oxidizing, a tilt implantation is performed to implant an impurity into the semiconductor fin. The oxide layer is removed after the tilt implantation.

In accordance with other embodiments, a method includes oxidizing a semiconductor fin to form an oxide layer on opposite sidewalls of the semiconductor fin, wherein the semiconductor fin is over top surfaces of STI regions. A semiconductor strip is underlying and connected to the semiconductor fin, and the semiconductor strip is level with the STI regions. After the oxidizing, a tilt implantation is performed to implant an impurity into the semiconductor fin, wherein the impurity is of a first conductivity type. After the step of tilt implantation, the oxide layer is removed. The method further includes forming a gate dielectric comprising a portion on a sidewall of the semiconductor fin, forming a gate electrode over the gate dielectric, and forming a source/drain region adjacent to the gate dielectric and the gate electrode. The source/drain region is of a second conductivity type opposite the first conductivity type.

In accordance with yet other embodiments, a device includes a semiconductor substrate, and a semiconductor strip overlying and connected to the semiconductor substrate. The semiconductor strip has a first sidewall that is substantially planar and in a first plane, and a second sidewall opposite to the first sidewall, wherein the second sidewall is substantially planar, and is in a second plane. STI regions are disposed on opposite sides of the semiconductor strip. A semiconductor fin is disposed over and connected to the semiconductor strip, wherein the semiconductor fin includes a third sidewall that is substantially planar, wherein the third sidewall is in a third plane substantially parallel to, and not overlapping, the first plane. The semiconductor fin further includes a fourth sidewall that is substantially planar and opposite to the third sidewall. The fourth sidewall is in a fourth plane substantially parallel to, and not overlapping, the second plane. The third sidewall and the fourth sidewall are in the region between the first and the second planes.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    an isolation region;
    a semiconductor strip in the isolation region, wherein the semiconductor strip comprises a first sidewall in a first plane, wherein the first sidewall is substantially straight;
    a semiconductor fin protruding higher than the isolation region, wherein the semiconductor fin overlaps, and is connected to, the semiconductor strip, and the semiconductor fin comprises a curved top surface, and a second sidewall in a second plane and connected to the curved top surface, wherein the second sidewall is substantially straight, and the second plane is misaligned from the first plane, and wherein the second plane is substantially parallel to the first plane; and
    a transition semiconductor region comprising a third sidewall smoothly connecting the first sidewall to the second sidewall.

2. The device of claim 1, wherein the isolation region has a U-shaped top surface, and wherein the transition semiconductor region comprises a portion at a same level as a portion of the U-shaped top surface of the isolation region.

3. The device of claim 2, wherein a bottommost point of the U-shaped top surface is at substantially a same level as a top end of the first sidewall that is substantially straight.

4. The device of claim 1, wherein from a top end of the second sidewall to a topmost point of the curved top surface, the curved top surface is continuously curved.

5. The device of claim 1, wherein the third sidewall of the transition semiconductor region comprises a substantially straight portion and curved portions connected to a top end and a bottom end of the substantially straight portion of the third sidewall.

6. The device of claim 1, wherein the semiconductor strip comprises a fourth sidewall that is substantially straight, with the first sidewall and the fourth sidewall being opposite sidewalls of the semiconductor strip, and the semiconductor fin comprises a fifth sidewall that is substantially straight, with the second sidewall and the fifth sidewall being opposite sidewalls of the semiconductor fin, and the fourth sidewall and the fifth sidewall are in a fourth plane and a fifth plane, respectively, and wherein the second sidewall and the fifth sidewall are between the first plane and the fourth plane.

7. The device of claim 1, wherein higher portions of the semiconductor strip are increasingly narrower than respective lower portions of the semiconductor strip, and higher portions of the semiconductor fin are increasingly narrower than respective lower portions of the semiconductor fin.

8. The device of claim 1, wherein the isolation region comprises a top portion, and the top portion is tapered and comprises a first additional sidewall contacting the transition semiconductor region, and a second additional sidewall opposite to the first additional sidewall, wherein the second additional sidewall is a concave sidewall, and the concave sidewall is at a same level as the transition semiconductor region.

9. A device comprising:
a semiconductor substrate;
a semiconductor strip overlying and connected to the semiconductor substrate, wherein the semiconductor strip comprises:
   a first sidewall that is substantially straight and in a first plane;
   a second sidewall that is substantially straight and in a second plane, wherein the first sidewall and the second sidewall are opposite sidewalls of the semiconductor strip; and
   a third sidewall that is substantially straight, wherein the third sidewall is connected between the first sidewall and the second sidewall;
Shallow Trench Isolation (STI) regions contacting opposite sidewalls of the semiconductor strip, wherein the STI regions comprise a top portion, and the top portion is tapered and comprises a concave sidewall that is at a same level as the third sidewall; and
a semiconductor fin protruding higher than a top surface of the STI regions, wherein the semiconductor fin has a first middle width measured at a middle height of the semiconductor fin, and wherein at the middle height, the first plane is spaced apart from the second plane with a second middle width therebetween, and the first middle width is smaller than about 75 percent of the second middle width.

10. The device of claim 9, wherein the first middle width is between about 55 percent and about 75 percent of the second middle width.

11. The device of claim 9, wherein the first middle width is between about 25 percent and about 45 percent of the second middle width.

12. The device of claim 9, wherein the semiconductor fin has a continuously curved top end.

13. The device of claim 9 further comprising a transition semiconductor region having a third sidewall underlying and connected to the first sidewall, wherein the third sidewall is less vertical than the first sidewall and the second sidewall.

14. The device of claim 13, wherein the semiconductor fin has an impurity having a first impurity concentration, and the transition semiconductor region has the impurity having a second impurity concentration higher than the first impurity concentration, and the impurity is of p-type or n-type.

15. The device of claim 9, wherein the first sidewall and the second sidewall are more upright than the third sidewall.

16. A device comprising:
a semiconductor substrate;
a semiconductor strip overlying and connected to the semiconductor substrate;
a semiconductor fin over and connected to the semiconductor strip, wherein the semiconductor fin and the semiconductor strip in combination comprise:
   a lower portion having a first tapering rate;
   an upper portion having a second tapering rate; and
   a middle portion continuously connecting the upper portion to the lower portion, with the middle portion having a third tapering rate greater than the first tapering rate and the second tapering rate;
a gate dielectric comprising a high-k dielectric material, with the upper portion being between opposite portions of the gate dielectric, and the gate dielectric is in contact with the semiconductor fin; and
a metal gate having a bottom surface contacting a top surface of the gate dielectric.

17. The device of claim 16, wherein the first tapering rate, the second tapering rate, and the third tapering rate are ratios of reduction in widths to increase in height of respective lower portion, upper portion, and the middle portion, and wherein the first tapering rate is substantially equal to the third tapering rate.

18. The device of claim 16, wherein the semiconductor fin has a continuously curved top end.

19. The device of claim 16, wherein a bottommost surface of the gate dielectric is substantially level with a connecting point between the lower portion and the middle portion.

20. The device of claim 16 further comprising isolation regions on opposite sides of, and contacting, the semiconductor strip, wherein the middle portion is at a same level as a top portion of the isolation region.

* * * * *